United States Patent
Bauer et al.

[11] Patent Number: 6,097,536
[45] Date of Patent: Aug. 1, 2000

[54] OPTICAL MOUNT WITH UV ADHESIVE AND PROTECTIVE LAYER

[75] Inventors: Harry Bauer, Aalen-Ebnat; Sascha Kraus, Aalen; Hans G Keck, Neu-Ulm; Jörg Endler, Heubach; Hans-Joachim Weippert, Aalen, all of Germany

[73] Assignee: Carl-Zeiss-Stiftung, Germany

[21] Appl. No.: 09/126,693

[22] Filed: Jul. 30, 1998

[30] Foreign Application Priority Data

Jan. 8, 1997 [DE] Germany ............................ 197 33 490

[51] Int. Cl.[7] ................................. F21V 9/06; G02B 7/02
[52] U.S. Cl. ........................... 359/350; 359/361; 359/819
[58] Field of Search .................................. 359/361, 359, 359/358, 819, 722

[56] References Cited

U.S. PATENT DOCUMENTS 5,493,442  2/1996  Buchholz et al. ...................... 359/361

FOREIGN PATENT DOCUMENTS 08072300  3/1996  Japan ................................. B41J 2/44
09184917  7/1997  Japan ................................. G02B 5/30

Primary Examiner—Cassandra Spyrou
Assistant Examiner—Fayez Assaf

[57] ABSTRACT

An assembly includes a holder and a transparent component that transmits in the ultraviolet spectral region and is adhered by means of an adhesive. The adhesive is hardenable by UV light with a given spectral distribution. A layer is applied by thin film technology on the transparent component in the region of the adhesive and transmits UV light of the spectral region suitable for hardening the adhesive and to a high degree reflects and/or absorbs UV light within a useful spectral region within the spectral region transmitted by the transparent component.

17 Claims, 2 Drawing Sheets

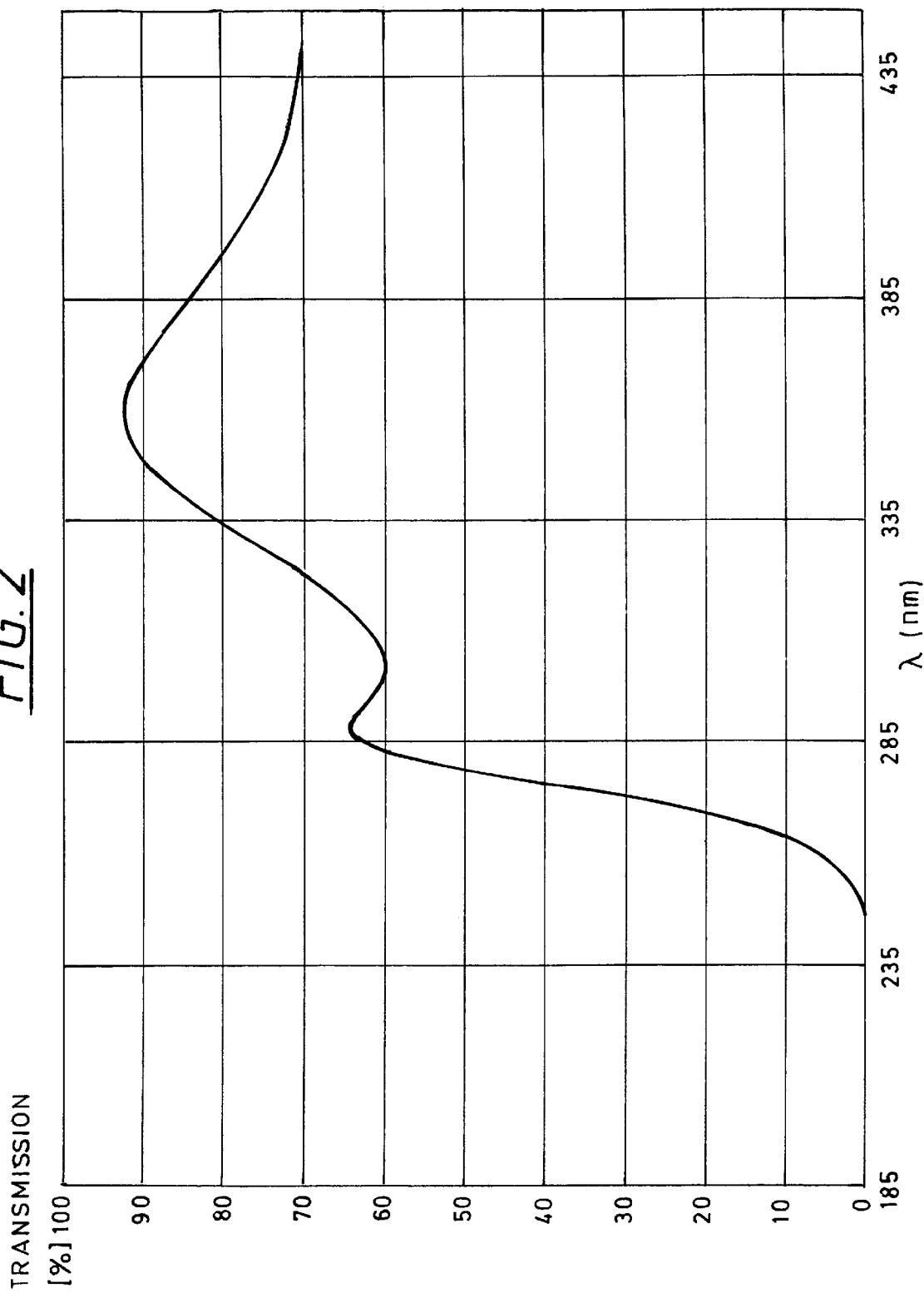

OPTICAL MOUNT WITH UV ADHESIVE AND PROTECTIVE LAYER

BACKGROUND OF THE INVENTION

1. Field of the Invention

The invention relates to an assembly including a holder—in particular, a mount—and a transparent, preferably optical, component that transmits in the ultraviolet spectral region, and more particularly to an assembly in which an adhesive can be hardened by means of UV light within a given spectral distribution.

2. Discussion of Relevant Art

Japanese Patent document 8-72300 provides an example of such an assembly with an ultraviolet curable adhesive. Such assemblies form, among other things, mounted lenses and the like of illumination systems and projection systems for microlithography.

Adhesive bonding to a mount is known, for example, for automobile and architectural glass, wherein the adhesive is protected from the effects of solar UV irradiation by means of UV-absorbing fillers and protective layers.

Thin layers of dielectrics, and in protective layers with thicknesses in the micrometer range, are known in the optical field, and are applied by vacuum deposition, sputtering, PVD or CVD. Such a protective layer for UV hardening bonds is described in Japanese Patent publication 9-184917.

According to Naumann, Schröder, Constructional Elements of Optics, Munich and Vienna 1983, page 72, such layers of cryolite, magnesium fluoride, cerium fluoride, zinc sulfide and titanium dioxide have lower transmission limits of 0.12 to 0.4 $\mu$m. Tantalum pentoxide, hafnium dioxide and mixtures of them transmit from 0.3 $\mu$m or 0.32 $\mu$m, according to Soviet Patent Document SU 48 23 642/33.

In general, the exact reflection, absorption, and transmission spectra of these thin layers in the Deep Ultraviolet (DUV) region are not known, since the effects of the substrate and of the spectrometer/monochromator components are difficult to detect, and these materials have not been tested outside the planned field of application.

It has been found that the known mount adhesives based on epoxy resin, which can be hardened with UV light of the Hg-I line, can be considerably damaged by irradiation with DUV light at 248 nm and even more at 193 nm, in DUV projection exposure equipment, and by their failure limit the life of the equipment.

DUV absorbing fillers in the adhesive mass do not prevent failure of the boundary layer of the adhesive adjacent to the quartz glass.

SUMMARY OF THE INVENTION

The object of the invention is to provide an assembly of the stated kind, in which the adhesive can be hardened with UV light, particularly the Hg-I line, and is also stable against UV light in useful spectral regions, especially in the short wavelength DUV region. The reflection of light from the region of the adhesive is to be suppressed as far as possible, since such scattered light has a troublesome effect in the optics. A process for producing the assembly and use of the assembly also are objectives of the invention.

This object is achieved by an assembly having a holder, a transparent component that transmits in the ultraviolet (UV) spectral region and is adhered by means of an adhesive that is hardenable by UV light in a given spectral region, and a layer that is applied by thin film technology on the transparent component in a region of the adhesive and transmits UV light of the given spectral region suitable for hardening the adhesive and to a high degree obstructs transmission of UV light within a useful spectral region by absorbing and/or reflecting light within the UV spectral region transmitted by the transparent component.

The production process according to the invention involves producing a transparent optical component attached to a mount by means of UV-hardenable adhesive by selecting a thin film layer to transmit light suitable for hardening the adhesive and to a high degree obstruct transmission of UV light in a useful spectral region by absorption and/or reflection, within the spectral regions transmitted by the optical component, and covering the component with a thin layer in the region of the adhesive by means of thin film technology. The assembly can be used in microlithogrophy projection exposure equipment.

Thus, starting from the established mounting technique with UV hardening adhesives, by the introduction of a single coating, that can be integrated with the treatment for application of anti-reflection layers, which is required in any case, it is possible to permanently mount the lens that is suitable for DUV.

BRIEF DESCRIPTION OF THE DRAWINGS

The invention will be described in further detail taken together the accompanying drawings, in which:

FIG. 2 shows the transmission spectrum of a suitable $Ta_2O_5$ layer.

DETAILED DESCRIPTION OF PREFERRED EMBODIMENTS

Figure 1:
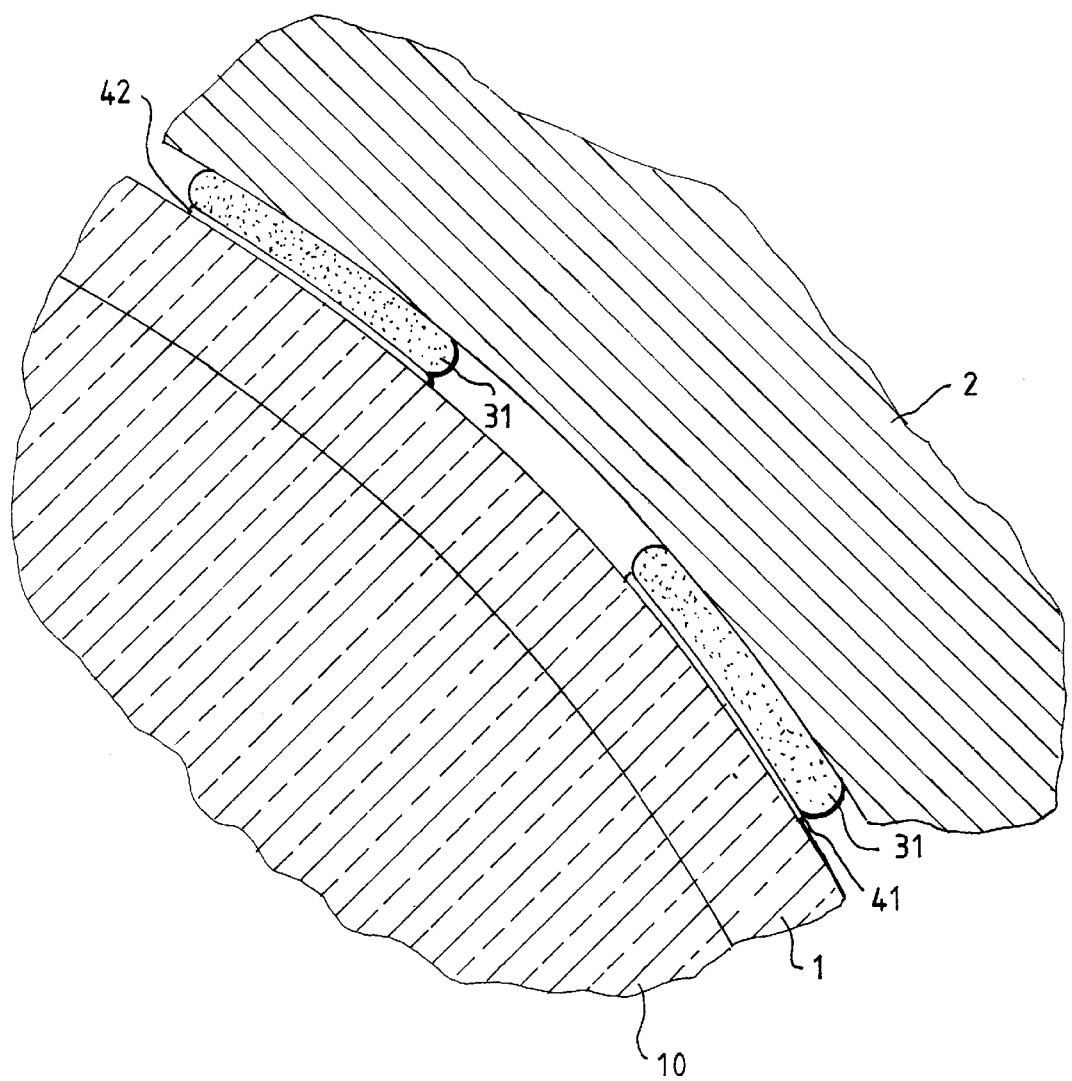
FIG. 1 shows an assembly according to the invention, in a schematic detail view.

The assembly schematically shown in FIG. 1 has a transparent component 1, namely a lens, a flat plate, a prism, a Mangin mirror or a transmitting diffractive optical element in a mount 2, made of metal or ceramic/glass-ceramic, which is not UV transparent. These parts, 1 and 2, are connected together by layers 31, 32 of adhesive, which are formed as distributed sections over the edge of the transparent component 1, or as a continuous layer throughout. The adhesive layers 31, 32 consist of UV-hardenable (or UV-hardened) adhesive based on epoxy resin, such as, e.g., Omnifit UV-4000 of Omnitechnic GmbH, Hannover.

The adhesive in this arrangement can be hardened through the transparent optical component 1 with Hg-I light of a high-pressure mercury lamp.

Since the adhesive is photochemically unstable to light with shorter wavelengths, in particular, the light from excimer lasers at 248 nm or 193 nm—as is required in projection exposure equipment for microlithography of the latest constructional forms—an adhesive-protecting layer 41, 42 for each layer of adhesive 31, 32 is required and is provided according to the invention. This can either be applied at the place of the later adhesion, or on the opposing surface of the transparent component 1.

A thin layer of tantalum pentoxide ($Ta_2O_5$), for example, is suitable, and can be applied like an optical layer (for anti-reflection and the like). It can, for example, be vapor deposited in a vacuum as a single layer.

The thickness is determined as $n \times \lambda/2$ for the optical path length at the hardening wavelength of 365 nm with n=1 for the useful wavelength of 193 nm or n=2 for the useful wavelength of 248 nm.

There are thereby attained a high transmission of more than 85% at the hardening wavelength of 365 nm, a very low transmission, under 2%, at the useful wavelength of 248 nm and thereunder, and at the same time a high absorption and a small reflection throughout, in both spectral regions.

FIG. 2 shows the transmission spectrum of such a tantalum pentoxide layer on Suprasil quartz glass, measured at 7° to the surface normal.

A further reduction of the reflection can be attained by targeted multiple layers (anti-reflection layers).

The tensile strength and tensile shear strength of the layer should be at least 10 N/mm$^2$ on quartz glass, so that the adhesive strength of the adhesive bonding is not reduced.

The layer is chemically stable under the environmental conditions during the production and operation of DUV projection exposure equipment for microlithography.

Such as assembly coated with tantalum pentoxide now withstands an irradiation with 248 nm DUV light so well that the life of the whole system is not limited by the life of the adhesive bonding.

It is quite important for the functioning of the optical component 1 that the functional surfaces 10 serving for transmission are not contaminated with the absorbing tantalum pentoxide layer. The vapor deposition therefore takes place with an apparatus which hermetically seals these surfaces 10, e.g. with elastically tensioned annular blades.

The adhesive-protection layer 41, 42 is preferably applied before the anti-reflection layers for the transmitting surfaces 10, so that a possible contamination is less serious.

The use of tantalum pentoxide on quartz glass, and also the wavelengths of 365 nm, 248 nm or 193 nm are preferred examples here. Other suitable materials, whose transmission decreases in the DUV region, are described as examples in the above introduction. Mixtures of materials are also relevant, as shown in the cited Soviet Patent document.

Besides quartz glass and the like as the transparent substrate, calcium fluoride and germanium dioxide glass (as described in German Patent Document DE 196 33 128.5 of Schuster) are also suitable.

In addition to the use in projection microlithography, the assemblies according to the invention are also especially suitable for DUV laser optics, especially for exit windows of excimer lasers.

We claim:

1. An assembly, comprising:
   a holder (2),
   a transparent component (1) that transmits in the ultraviolet (UV) spectral region and is adhered by means of an adhesive (31, 32),
   said adhesive (31, 32) being hardenable by UV light in a given spectral region, and
   a layer (41, 42) that is applied by thin film technology on said transparent component (1) in a region of said adhesive (31, 32) and transmits UV light of said given special region suitable for hardening said adhesive (31, 32) and at least to a high degree obstructs transmission of UV light within a predetermined spectral region by at least absorbing or reflecting UV light, within said UV spectral region transmitted by said transparent component (1), said transparent component having a transmitting zone (10), and said layer (41, 42) being located outside said transmitting zone (10).

2. The assembly according to claim 1, in which said layer (41, 42) transmits less than 5% in said useful spectral region.

3. The assembly according to claim 2, in which said layer (41, 42) transmits less than 2% in said useful spectral region.

4. The assembly according to claim 1, in which said layer (41, 42) attains over 50% transmission in said given spectral region suitable for hardening.

5. The assembly according to claim 4, in which said layer (41, 42) attains over 80% transmission in said given spectral region suitable for hardening.

6. The assembly according to claim 1, in which said layer (41, 42) has a transmission boundary between said useful spectral region and said given spectral region suitable for hardening.

7. The assembly according to claim 6, in which said given spectral region suitable for hardening is a region of longer wavelength than said useful spectral region.

8. The assembly according to claim 1, in which said layer (41, 42) reflects less than 10% into said transparent component (1).

9. The assembly according to claim 1, in which said useful spectral region includes excimer laser lines at 248 nm or 193 nm, and said given spectral region suitable for hardening includes an Hg-I line at 365 nm.

10. The assembly according to claim 1, in which said layer (41, 42) is produced by one of the group consisting of vapor deposition, sputtering, physical vapor deposition (PVD) and chemical vapor deposition (CVD).

11. The assembly according to claim 1, in which said layer (41–42) is selected from the group consisting of tantalum pentoxide, hafnium dioxide, titanium dioxide, zinc sulfide, cerium fluoride, cryolite, magnesium fluoride, and mixtures of these.

12. The assembly according to claim 11, in which said layer (41, 42) is applied at a temperature of said transparent component of less than 100° C.

13. The assembly according to claim 1, in which said transparent component (1) is selected from the group consisting of quartz glass, calcium fluoride and germanium dioxide.

14. Use of an assembly according to claim 1, in microlithography projection exposure equipment.

15. Use of an assembly according to claim 1, as a Deep Ultra Violet (DUV) laser component.

16. Process for producing an optical assembly, comprising the following process steps:
   (a) covering an optical component (1) only outside its functional faces (10) that serve for transmission with a layer (41, 42) that is applied by thin film technology and to a high degree at least reflects or absorbs radiated light in a predetermined UV wavelength region, within a wavelength region transmitted by said optical component (1), and which is transparent in a long UV wavelength region in which an adhesive hardens,
   (b) applying said adhesive between said thin layer (41, 42) and a holder (2), and
   (c) hardening said adhesive by irradiated said adhesive with UV light in said adhesive-hardening wavelength region that passes through said optical component and said thin layer (41, 42).

17. The process according to claim 16, further comprising forming said laser component as an exit window.

* * * * *